US000001972H

(19) United States

(12) Statutory Invention Registration (10) Reg. No.: US H1972 H

Inoue (43) Published: Jul. 3, 2001

(54) AUTOFOCUS SYSTEM USING COMMON PATH INTERFEROMETRY

(75) Inventor: Fuyuhiko Inoue, San Mateo, CA (US)

(73) Assignee: Nikon Corporation, Tokyo (JP)

(21) Appl. No.: 09/167,525

(22) Filed: Oct. 6, 1998

(51) Int. Cl.[7] ..... G01B 9/02

(52) U.S. Cl. ..... 356/353; 356/354

(58) Field of Search ..... 356/353, 354

(56) References Cited

U.S. PATENT DOCUMENTS

| | | | | |
|---|---|---|---|---|
| 4,669,842 | | 6/1987 | Yomoda et al. | 353/101 |
| 4,714,331 | | 12/1987 | Oda et al. | 353/122 |
| 4,801,977 | | 1/1989 | Ishizaka et al. | 355/30 |
| 4,834,537 | * | 5/1989 | Rafanelli et al. | 356/353 |
| 4,998,821 | | 3/1991 | Ohta et al. | 353/122 |
| 5,137,349 | | 8/1992 | Taniguchi et al. | 353/122 |
| 5,235,400 | | 8/1993 | Terasawa et al. | 356/237 |
| 5,394,244 | | 2/1995 | Tsai | 356/361 |
| 5,448,332 | | 9/1995 | Sakakibara et al. | 355/53 |
| 5,459,576 | | 10/1995 | Brunfeld et al. | 356/353 |
| 5,469,259 | | 11/1995 | Golby et al. | 356/351 |
| 5,495,334 | | 2/1996 | Nagoshi et al. | 356/346 |
| 5,537,209 | | 7/1996 | Lis | 356/349 |
| 5,585,922 | | 12/1996 | Sueyoshi | 356/358 |
| 5,589,938 | | 12/1996 | Deck | 356/359 |
| 5,633,720 | | 5/1997 | Takahashi | 356/401 |
| 5,650,853 | | 7/1997 | Honda et al. | 356/359 |
| 5,654,553 | | 8/1997 | Kawakubo et al. | 250/548 |

* cited by examiner

*Primary Examiner*—Daniel T. Pihulic

(74) *Attorney, Agent, or Firm*—Skjerven, Morrill, MacPherson, Franklin & Friel LLP

(57) ABSTRACT

An autofocus system for use for instance in a photolithography machine (but not so limited) uses oblique incident optics which transform a defocus of the plane of the wafer whose location is being detected to a lateral shear of the beam. A common path interferometer measures the lateral shear. The common path interferometer is for instance a triangular path interferometer. Since both the signal (object) light beam and the reference light beams transverse almost exactly the same optical path, the system is thereby independent of mechanical vibration or other environmental influence such as temperature variations. Compensation is provided for refractive effects caused by local atmospheric heating immediately above the wafer surface.

13 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

AUTOFOCUS SYSTEM USING COMMON PATH INTERFEROMETRY

BACKGROUND

1. Field of the Invention

This invention relates to interferometry and more particularly to an autofocus system using a common path interferometer.

2. Description of the Prior Art

Autofocus systems are well known, for instance in the photography field. Typically an autofocus system includes a range finding device to determine the distance from the lens system to the object to be imaged. For instance, some autofocus systems use infrared range finding or ultrasonic range finding. In addition to the photography field, autofocus is also used in the lithography field where the goal is to form an image on a resist coated semiconductor wafer. In this case typically the focus adjustment is the distance between the projection lens system of a photolithography tool and the image plane which is the surface of the resist formed on a wafer. Photolithography as used in the semiconductor field is extremely precise and the autofocus system must correspondingly be extremely precise since the feature sizes being imaged are typically very small, for instance 0.25 micrometers. It is known to use an oblique incident optical system for lithography auto focusing, where displacement of a light beam is measured by a sensor. It is to be understood that "in focus" in this context means that the image plane is at a particular distance from the projection optical system.

However, it has been found that in general vibrations and random air fluctuations are still a problem in an autofocus system using oblique incident optics. In general, compensation for this vibration is not possible, leading to a degradation of the accuracy of the autofocusing.

SUMMARY

In accordance with this invention a common path interferometer is used in, e.g., an autofocus system and includes oblique incident optics which transform a defocus of the reflective surface to a lateral shear of the interferometer beam. A common path interferometry measures the lateral shear. The common path interferometer is a triangular path interferometer in one embodiment. Since both the signal (first) light beam and the reference (second) light beam (e.g. a clockwise and counterclockwise directional beam) pass through almost the same optical path in this type of interferometer, the system is thereby rendered independent of adverse affects from mechanical vibrations and also random air fluctuations.

Hence this common path interferometer allows measuring of any deviation between the actual position of the reflected surface and its intended position, for purposes e.g. of autofocusing, by directing a first beam and a second beam onto the reflective surface (for instance the surface of a semiconductor wafer), the reference beam and the signal beam being parallel and spaced apart. At the detector end, the first beam and the second beam are detected after being reflected from the wafer or the reflective surface. Then the deviation between these two beams is determined as a function of a distance in a plane e.g. orthogonal to that of the reflective surface, between axes defined by respectively the first beam, the reflected first beam and the second signal beam. Thus any change in focus (the position of the reflective surface) is transformed into a lateral shear between a clockwise path and a counterclockwise path of the triangular path interferometer. The lateral shear is transformed to a spatial frequency of the fringe for purposes of detection in one embodiment.

In one embodiment, the presence of a layer of heated air (atmosphere) immediately over the surface of the wafer provides some distortion to the interferometry which is compensated for in accordance with the invention.

A typical application of the present invention is for use in an exposure apparatus as used in photolithography, for example in semiconductor fabrication, as described above. See e.g. Sakakibara et al., U.S. Pat. No. 5,448,332, incorporated by reference herein in its entirety for a description of such an exposure apparatus.

DETAILED DESCRIPTION

Figure 1:
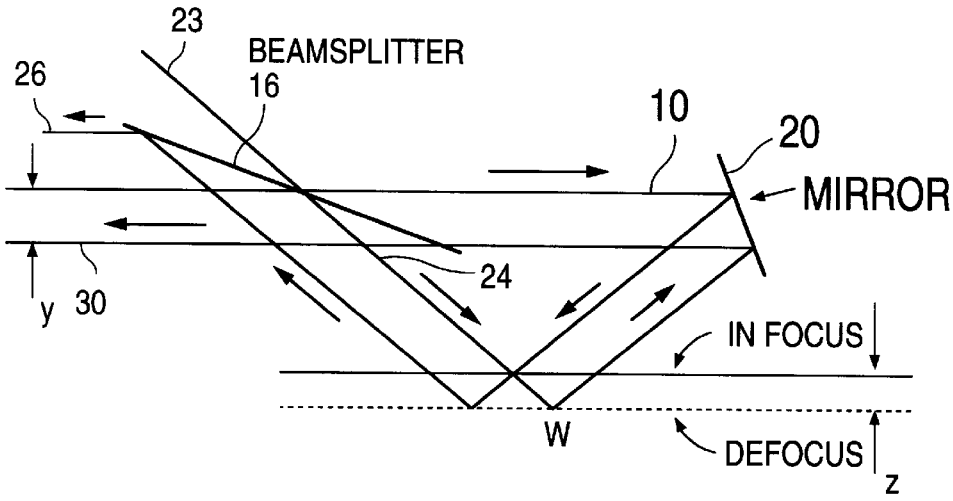
FIG. 1 shows schematically a triangular path interferometry apparatus and method in accordance with this invention.

FIG. 1 shows schematically a common path interferometer arrangement using a triangular path, in accordance with this invention. This illustrates both a method and apparatus in accordance with this invention. It is to be understood that the apparatus itself consists of conventional optical and interferometer elements which are not shown in detail, but which are commercially available. In FIG. 1 the object the distance to which is being measured for e.g. autofocusing is a wafer W which is the workpiece in a semiconductor lithography tool. This wafer W typically has a planar upper surface which is the reflective surface for the interferometry measurement.

It is to be understood that in the photolithography autofocus application as described above, the goal is to measure the distance from the projection lens of the lithography tool which forms an image on the surface of the wafer to the wafer surface (resist) itself. As shown in FIG. 1, two illustrative positions of the wafer are shown in terms of the vertical (z) axis; these are the in focus and the defocus positions. Typically the autofocus system moves the wafer and/or projection lens in the Z direction so that the wafer lies in the in focus plane. In this case what is practically being done is measuring the distance from the projection lens to the wafer surface, since the autofocus system is calibrated to the focal plane of the projection lens. This is because the optical system is designed for a particular distance between the projection lens and the wafer surface.

This system includes oblique incident optics which transform the defocus position to a lateral shear of the beam and a common path interferometer which measures this lateral shear. In this case the common path interferometer is the illustrated triangular path interferometer. Since both the signal (object) light beam and the reference light beam transverse almost the same identical optical path, the system is independent of mechanical vibration. As shown in FIG. 1, a change in the focus distance z is transformed into a lateral shear distance Y between the clockwise path light beam 10 and the counterclockwise light beam path 14 for this triangular path interferometer. (The direction of the light beams is indicated by the arrows.) As typical of such interferometers, there is included a beam splitter 16 and a mirror 20; these are each conventional elements. The mounts for these elements are not shown but typically they are mounted on, for instance, the lower portion of the projection lens. The lateral shear Y is a distance which is measured by a conventional, e.g., CCD sensor.

As a matter of background, the general principle of interferometry is well known wherein two parallel wave fronts are received, one of which reflects from a reference mirror and the second reflects from a second (signal) mirror. Both wave fronts are parallel. The phase shift between the two wavefronts is constant at any position on the field of view and hence the resulting interference fringe is of one color. The phase shift of course is caused by the optical path length difference between the reference mirror path and the signal mirror path. If the signal mirror is tilted slightly, the wavefronts also tilt with regard to one another, causing a fringe. The spatial frequency of this fringe depends on the tilt angle. In the case of a shearing interferometry system, if the incident beam wavefront has a curvature and the lateral shear is zero, the fringe is of one color.

However, if there is lateral shearing, in accordance with the invention there is a phase difference that makes the fringe in this frequency depend on the lateral shear of value. This fringe is not of constant pitch because the wavefront is spherical. However, if the radius of the wavefront is big enough, the fringe pitch is approximately constant. Therefore this defines the spatial frequency. A conventional CCD (line sensor or two dimensional sensor) optically acquires the fringe pattern and a suitable computer using a fast Fourier transform calculates the frequency of the fringe using the relationships as set forth below.

With reference to FIG. 1, the original incident coherent beam 23 (See FIG. 1) is provided from, for instance, a laser (not shown). Light beam 23 impinges on the upper surface of the beam splitter 16 and is split thereby so that a portion 24 passes through the beam splitter 16 while another portion 10 is reflected from the beam splitter onto the reflective surface of wafer W, whether in the in focus or defocus position. The portion of the split beam 10 which is reflected from the beam splitter 16 reflects off the mirror 20 and onto the reflective surface of wafer W where it is reflected back and reflects off the lower surface of beam splitter 16 and is the return beam 26 at the detector. At the same time, the beam 24 also reflects off the surface of wafer W and then off the surface of mirror 20 and returns as beam 30. Hence the lateral shear of interest is the distance 2Y, less any distance between the return beam 30 and the return beam 26.

In other words, for the "in focus" position for the clockwise and counter clockwise beams there is no lateral separation between the beams. In the defocus situation, the defocusing causes a shearing (distance 2Y) between the clockwise and counter-clockwise return beams 26, 30.

Figure 2:
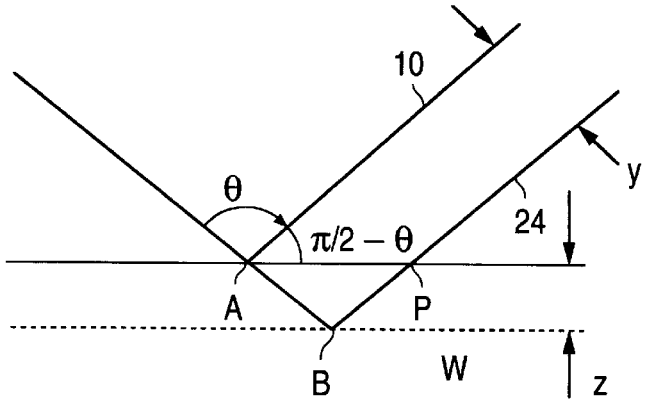
FIG. 2 shows detail of FIG. 1.

Pertinent detail of the FIG. 1 configuration is shown in FIG. 2. The incident beam position for the in focus position of the wafer W is at point A and the incident beam at the defocus position of the wafer is at point B. Hence the reflected beam, depending on the in focus or defocus position, shifts from A to B which is the same as distance Y. This distance Y shown in the right-hand portion of FIG. 2 becomes the same as distance Y shown in the left-hand portion of FIG. 1. The point at which the beam reflected from point B crosses the infocus plane is point P. Hence the angle subtended by the incident and reflected beam from the in focus plane is angle θ as illustrated.

Where the incident angle is θ, distance AP is:

$$AP=2z\tan\theta \tag{1-1}$$

Lateral shear y is:

$$y = AP\sin\left(\frac{\pi}{2}-\theta\right) \tag{1-2}$$

By (1-1) and (1-2):

$$y=2z\sin\theta \tag{1-3}$$

Figure 3:
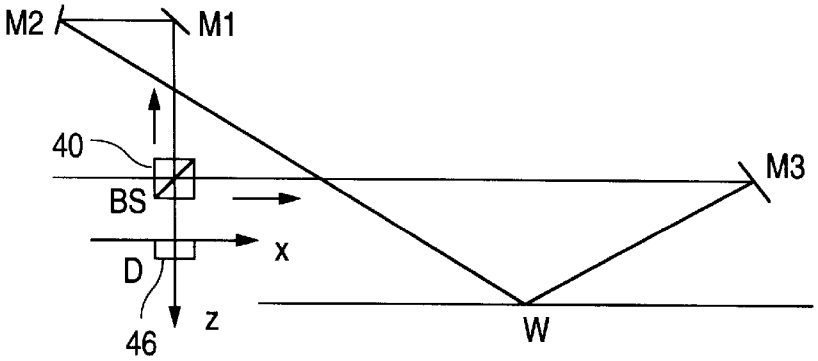
FIG. 3 shows another embodiment in accordance with the invention wherein the lateral shear is transformed to a spatial frequency of the fringe.

Another embodiment, shown in FIG. 3, transforms a lateral shear of the reflected beams to a spatial frequency of the fringe. Hence in FIG. 3, which shows a variant of the FIG. 1 arrangement, the beam splitter 40 operates in conjunction with mirrors M1, M2, and M3 where D is the photodetector 46 and again W is the wafer. (In this case only one position of the wafer W surface is shown for simplicity.) The positions of beam splitter 40 and the wafer W surface are conjugate for both the clockwise beams (from beam splitter 40 to mirror M3 to the wafer W surface) and for the counterclockwise path (from beam splitter 40 to mirror M1 to mirror M2 to the wafer surface). The incident wavefront to the beam splitter 40 has a curvature R. Each beam shifts a distance Y (not illustrated) from the optical axis where the wafer is defocused by a distance z. The x and y axes are illustrated.

At the location of detector D46 which is located at the conjugate position of wafer W, each wavefront is on the coordinate system x and z is shown in FIG. 3, where y is the shearing direction:

$$(X-y)^2+Z_R^2=R^2,\ \text{so}\ Z_R=\sqrt{R^2-(X-y)^2} \tag{2-1}$$

$$(X+y)^2+Z_L^2=R^2,\ \text{so}\ Z_L=\sqrt{R^2-(X+y)^2} \tag{2-2}$$

The optical path difference Δ(x) at position X, where λ is the light wavelength, is:

$$\Delta(X)=(2\pi/\lambda)\left(\sqrt{R^2-(X+y)^2}-\sqrt{R^2-(X-y)^2}\right) \tag{2-3}$$

The interference fringe on the detector D 46 is calculated from (2-1) to (2-3);

$$i(X)=\left|e^{-jkZ_R(x)}-e^{-jkZ_L(X)}\right|^2=2+2\cos\{k(Z_L-Z_R)\}=2+2\cos\Delta(X) \tag{2-4}$$

where, $k=2\pi/\lambda$.

In the case of R>>X+y, X-y, equation (2-4) can be approximately calculated as follows using the above equations:

$$\Delta(X)\approx\frac{2kyX}{R}=\frac{4kXz\sin\theta}{R} \tag{2-5}$$

Equations (2-4) and (2-5) show how defocus distance z changes the spatial frequency of the fringe as in equation (2-5).

Also in accordance with the invention one can estimate peak position on the Fourier plane. This is done by calculating the spatial frequency of the fringe. The pattern of the fringe is Fourier-transformed and one measures the position of the peak.

In more detail, one calculates the Fourier transform of the received signal having frequency F of the fringe pattern acquired e.g. by a CCD (charge coupled device). The peak position F is measured. Then the frequency F of the fringe pattern is recalculated. The value z is calculated from F using equations (2-4) and (2-5) above, so F, the frequency from equations (2-4) is:

$$\frac{4kXz\sin\theta}{R} = \frac{2\pi 4z\sin\theta}{\lambda R}X, \text{ so } F = \frac{4z\sin\theta}{\lambda R}$$

where R, λ and θ are parameters of the apparatus that are easily determined.

The present inventor has recognized a problem associated with autofocusing in the semiconductor field as described above, in that accurate distance measuring using interferometry in an atmosphere is problematic where the air/gas atmosphere is unevenly warm. This is especially a problem where the warmer or cooler air (or gas) is in a layer. This is problem generally with common path interferometry subject to air temperature fluctuations. It is especially problematic if the heated air is present in a layer above a semiconductor wafer which is being autofocused, since this causes some beam shifting. Typically this is a problem because the exposing radiation used to expose the resist on the surface of the wafer, which is typically ultraviolet radiation, heats the wafer locally. This forms a layer of warm air directly above the wafer. This is especially a problem if the air circulation is poor in the environmental chamber surrounding the wafer, which sometimes occurs.

Thus problematically the wafer under exposure (or other reflective surface, the distance to which is being measured interferometrically) is heated, e.g. by incident radiation. The air immediately above the wafer is thereby also heated, creating a heated air region. Since this heated air, of course, has a different refractive index then the adjacent cooler air, this causes the interferometry beams to deviate as a result. Since in a typical semiconductor photolithography machine application the inside of the chamber is reasonably well air-conditioned, this heated air region is, for purposes of the following, regarded as a uniformly flat layer of constant thickness over the entire surface area of the wafer. While this is perhaps not literally true, to a first approximation one can assume that the heated air layer is uniform in temperature and thickness, (For the following discussion, it is not important if the layer is cooler or warmer than the surrounding air.)

Figure 4:
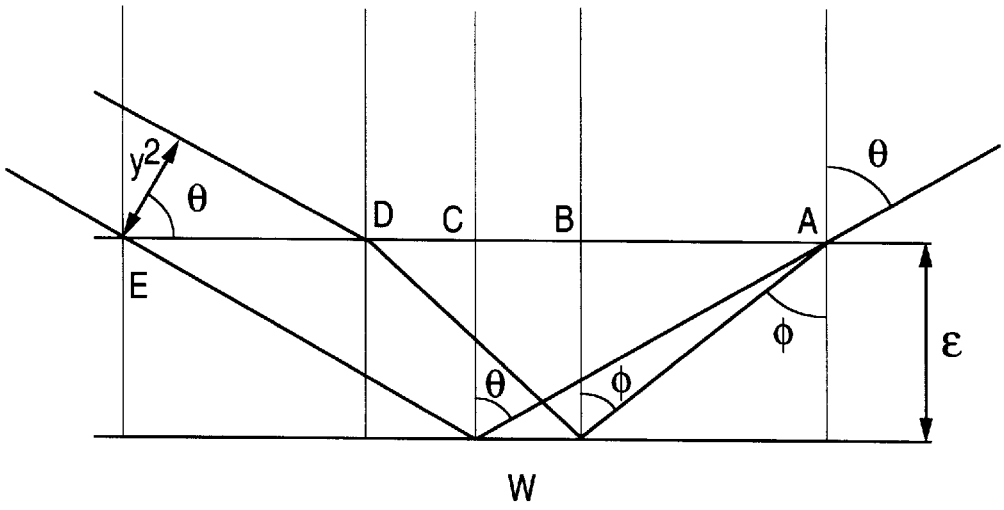
FIG. 4 shows the effect of a heated air layer on common path interferometry.

FIG. 4 shows interferometry beam shift caused by such air temperature fluctuation. This diagram is similar to FIGS. 1–3, although it shows only the wafer surface W and the incident and reflected beams.

The refractive index of the heated air layer is $n_a$, the thickness of the heated air layer is ϵ, the incident angle of the incident beam is θ and the refractive angle at the border between the heated air (gas) and the cool air (gas) is ϕ, so:

$$\sin\theta = n_a \sin\phi \quad (3\text{-}1)$$

$$\overline{AD} = 2\epsilon\tan\phi \quad (3\text{-}2)$$

$$\overline{AE} = 2\epsilon\tan\theta \quad (3\text{-}3)$$

Using (3-2) and (3-3);

$$\overline{DE} = \overline{AE} - \overline{AD} = 2\epsilon(\tan\theta - \tan\phi \mathbf{251} \quad (3\text{-}4)$$

The lateral shift $y_2$ caused by the heated air layer is;

$$y_2 = \overline{BC}\cos\theta = 2\epsilon(\sin\theta - \cos\theta\tan\phi) \quad (3\text{-}5)$$

Using (3-1);

$$y_2 = 2\varepsilon\sin\theta\left(1 - \frac{\cos\theta}{\sqrt{n_a^2 - \sin^2\theta}}\right) \quad (3\text{-}6)$$

Using equation (3-3) in an autofocus system using a common path interferometer and equation (3-6), the total lateral shift caused by the influence of the heated air layer is:

$$y = 2z\sin\theta + y_2 = 2z\sin\theta + 2\varepsilon\sin\theta\left(1 - \frac{\cos\theta}{\sqrt{n_a^2 - \sin^2\theta}}\right) \quad (3\text{-}7)$$

One may calculate z from (3-1). There are three unknown parameters in equations (3-1 to 3-7), which are z, ϵ, and $n_a$.

When interferometers having three different incidence angles are provided, the angles being $\theta_1$, $\theta_2$ and $\theta_3$, equation (3-7) is modified to:

$$y_i = 2z\sin\theta_i + 2\varepsilon\sin\theta_i\left(1 - \frac{\cos\theta_i}{\sqrt{n_a^2 - \sin^2\theta_i}}\right) \quad (3\text{-}8)$$

$$i = 1, 2, 3$$

Figure 5:
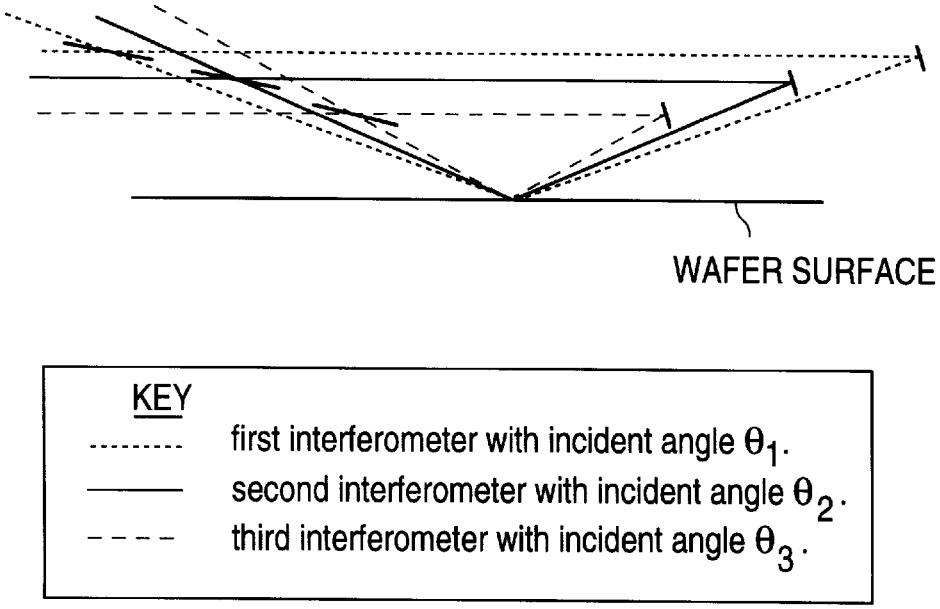
FIG. 5 shows schematically a three interferometer system to compensate for the effect of FIG. 4.

A suitable apparatus having three such interferometers is shown schematically in FIG. 5. In FIG. 5, three interferometer beams are illustrated, having three different angles $\theta_1$, $\theta_2$, $\theta_3$, incident on the wafer surface. A typical angular difference between the incident beams from the interferometers is, e.g. ½° or 1° (not limiting). Hence three sets of interferometer measurements allow solving equation (3-8) which has three unknowns z, ϵ. and $n_a$, thereby determining the effect of the heated layer, and allowing compensation for same.

The unknown parameters are z, ϵ, $n_a$. There are three equations:

$$y_1 = 2z\sin\theta_1 + 2\varepsilon\sin\theta_1\left(1 - \frac{\cos\theta_1}{\sqrt{n_a^2 - \sin^2\theta_1}}\right)$$

$$y_2 = 2z\sin\theta_2 + 2\varepsilon\sin\theta_2\left(1 - \frac{\cos\theta_2}{\sqrt{n_a^2 - \sin^2\theta_2}}\right)$$

$$y_3 = 2z\sin\theta_3 + 2\varepsilon\sin\theta_3\left(1 - \frac{\cos\theta_3}{\sqrt{n_a^2 - \sin^2\theta_3}}\right)$$

where $y_1$, $y_2$, $y_3$ are measured values, and $\theta_1$, $\theta_2$, $\theta_3$ are mechanical values (the incident angles) which are known. Values y1, y2, and y3 are measured.

Therefore, there are three unknown parameters which are z (the focus distance), and ϵ and $n_a$ for the heated layer, and three equations. Thus one can calculate z, ϵ, $n_a$ by solving these equations.

This description is illustrative and not limiting. Further modifications will be apparent to one skilled in the art in light of this disclosure and are intended to fall within the scope of the appended claims.

What is claimed is:

1. A method of measuring a deviation between a reflective surface and a nominal position of the reflective surface, comprising:

directing a first beam and a second beam onto the reflective surface; the first beam and second beam being parallel and spaced apart;

detecting the first beam and second beam as reflected from the reflected surface; and determining the deviation as a function of a distance, in a plane not parallel to that of the reflective surface, between axes defined by respectively the reflected second beam, the reflected first beam, and the incident second beam.

2. The method of claim 1, where the reflected second beam and reflected first beam define triangular paths moving in an opposite direction to that of the incident second beam.

3. The method of claim 1, wherein the second beam and first beam follow substantially the same optical path.

4. The method of claim 1, wherein the determining the deviation includes transforming the deviation into a change of a spatial frequency of an interference fringe.

5. An apparatus for measuring a deviation between a reflective surface and a nominal position of the reflective surface, comprising:

an illumination source;

a beam splitter located to split illumination from the source into a first beam and a second beam and to direct one of the first beam or second beam onto the reflective surface;

a reflector located to direct the other of the first beam or second beam onto the reflective surface;

a detector located to detect the first beam and second beam reflected from the reflective surface, and to determine the deviation as a function of a distance in a plane not parallel to that of the reflective surface, between axes defined by respectively the reflected second beam, the reflected first beam, and the illumination from the source.

6. The apparatus of claim 5, where the reflected second beam and reflected first beam define triangular paths moving in an opposite direction to that of the incident second beam.

7. The apparatus of claim 5, wherein the second beam and first beam follow substantially the same optical path.

8. The apparatus of claim 5, further comprising means for transforming the deviation into a change of a spatial frequency of an interference fringe.

9. A common path interferometer for measuring a distance to a reflective surface, comprising:

a beam splitter which directs a first beam and a second beam onto the reflective surface, wherein the first beam and second beam are parallel to one another but travel in opposite directions; and a detector located to detect the first beam and second beam reflected from the reflective surface and to determine the distance to the reflective surface as a function of a distance, in a plane orthogonal to that of the reflective surface, between the reflected first beam and the reflected second beam.

10. A method of interferometrically measuring a distance to a reflective surface, comprising:

directing three beams of light onto the surface, there being a differential temperature layer overlying the surface, the three beams of light having different angles of incidence onto the surface;

receiving the beams of light reflected from the surface; and interferometrically determining from the received beams a distance to the surface, a thickness of the layer, and an index of refraction of the layer.

11. The method of claim 10, wherein the receiving is by common path interferometry.

12. The method of claim 10, wherein the surface is a surface of a semiconductor wafer, and further comprising heating the wafer by incident exposing illumination, thereby heating the layer.

13. The method of claim 10, wherein the layer is a layer of heated air.

* * * * *